United States Patent [19]
Suzuki

[11] Patent Number: 6,057,795
[45] Date of Patent: May 2, 2000

[54] POWER SAVING A/D CONVERTER

[75] Inventor: Kenichi Suzuki, Tokyo, Japan

[73] Assignee: NEC Corporation, Tokyo, Japan

[21] Appl. No.: 08/907,868

[22] Filed: Aug. 11, 1997

[30] Foreign Application Priority Data

Aug. 9, 1996 [JP] Japan ................................. 8-227840

[51] Int. Cl.[7] ............................................... H03M 1/00
[52] U.S. Cl. .......................................................... 341/155
[58] Field of Search ................................. 341/155, 161, 341/162

[56] References Cited

U.S. PATENT DOCUMENTS

| | | | |
|---|---|---|---|
| 3,610,958 | 10/1971 | Reiling ..................................... | 341/122 |
| 5,294,928 | 3/1994 | Cooper et al. .......................... | 341/142 |
| 5,619,204 | 4/1997 | Byrne et al. ............................. | 341/155 |
| 5,754,135 | 5/1998 | Gerber et al. ........................... | 341/163 |

FOREIGN PATENT DOCUMENTS

| | | | |
|---|---|---|---|
| 3-185928 | 8/1991 | Japan .............................. | H03M 1/12 |
| 8-102675 | 4/1996 | Japan .............................. | H03M 1/42 |

OTHER PUBLICATIONS

English translation of Japanese Office Action dated Apr. 6, 1999.

*Primary Examiner*—Howard L. Williams
*Attorney, Agent, or Firm*—Sughrue, Mion, Zinn, Macpeak & Seas, PLLC

[57] ABSTRACT

An A/D conversion system comprises an A/D converter, a mode selection section for periodically selecting a conversion mode and a standby mode, and a control section for controlling the A/D converter based on the respective modes. The control section breaks the current path for the A/D converter during a standby mode. The duration of the standby mode can be specified from outside the system for power saving.

6 Claims, 8 Drawing Sheets

POWER SAVING A/D CONVERTER

BACKGROUND OF THE INVENTION (a) Field of the Invention

The present invention relates to a power saving A/D converter and, more particularly, to an A/D converter suited for use in a portable data communication system such as a personal data assistant (PDA).

(b) Description of the Related Art

An A/D converter is used in a portable data communication system for converting an analog input signal, such as an audio signal or image signal, to a digital output signal for data transmission.

JP-A-3(1991)-185928 proposes an A/D conversion system which repeats A/D conversion in a cyclic operation. FIG. 1 shows the proposed A/D conversion system, which comprises an A/D converter 12 for effecting A/D conversion and a control section 36 having therein an interval counter (not shown) for counting the clock pulses in the interval clock input 41.

Referring additionally to FIG. 2 showing the timing chart for the A/D converter of FIG. 1, after the interval counter in the control section 36 counts up to the setting of number of counts specified by the interval setting signal 19, the interval counter supplies a conversion start signal 38 to the A/D converter 12. The A/D converter 12 effects A/D conversion of the input analog signal 14, sets the output digital signal 20 after the completion of the conversion and supplies an end of conversion (EOC) signal 40 to the control section 36. The control section 36 then supplies a conversion stop signal 39 and activates the interval counter at the same time.

Subsequently, the interval counter again counts the clock pulses in the interval clock input 41 and supplies a conversion start signal 38 after the count up of the specified setting. These steps are repeated for a cyclic A/D conversion.

In a portable data communication system, power saving is increasingly requested for a longer operational period of a battery. However, the conventional A/D converter as described above does not sufficiently meet this request.

SUMMARY OF THE INVENTION

It is therefore an object of the present invention to provide an A/D conversion system suited for use in a portable data communication system by reducing the power consumption of the A/D converter.

The present invention provides an A/D conversion system comprising a mode selection section for periodically selecting a conversion mode and a standby mode of the A/D conversion system, an A/D converter for converting an analog input signal to a digital output signal during the conversion mode, and a control section for stopping operation of the A/D converter during the standby mode.

In accordance with the A/D conversion system according to the present invention, since the A/D converter is stopped for operation during the standby mode, power consumption of the A/D conversion system can be reduced.

The above and other objects, features and advantages of the present invention will be more apparent from the following description, referring to the accompanying drawings.

PREFERRED EMBODIMENTS OF THE INVENTION

Figure 1:
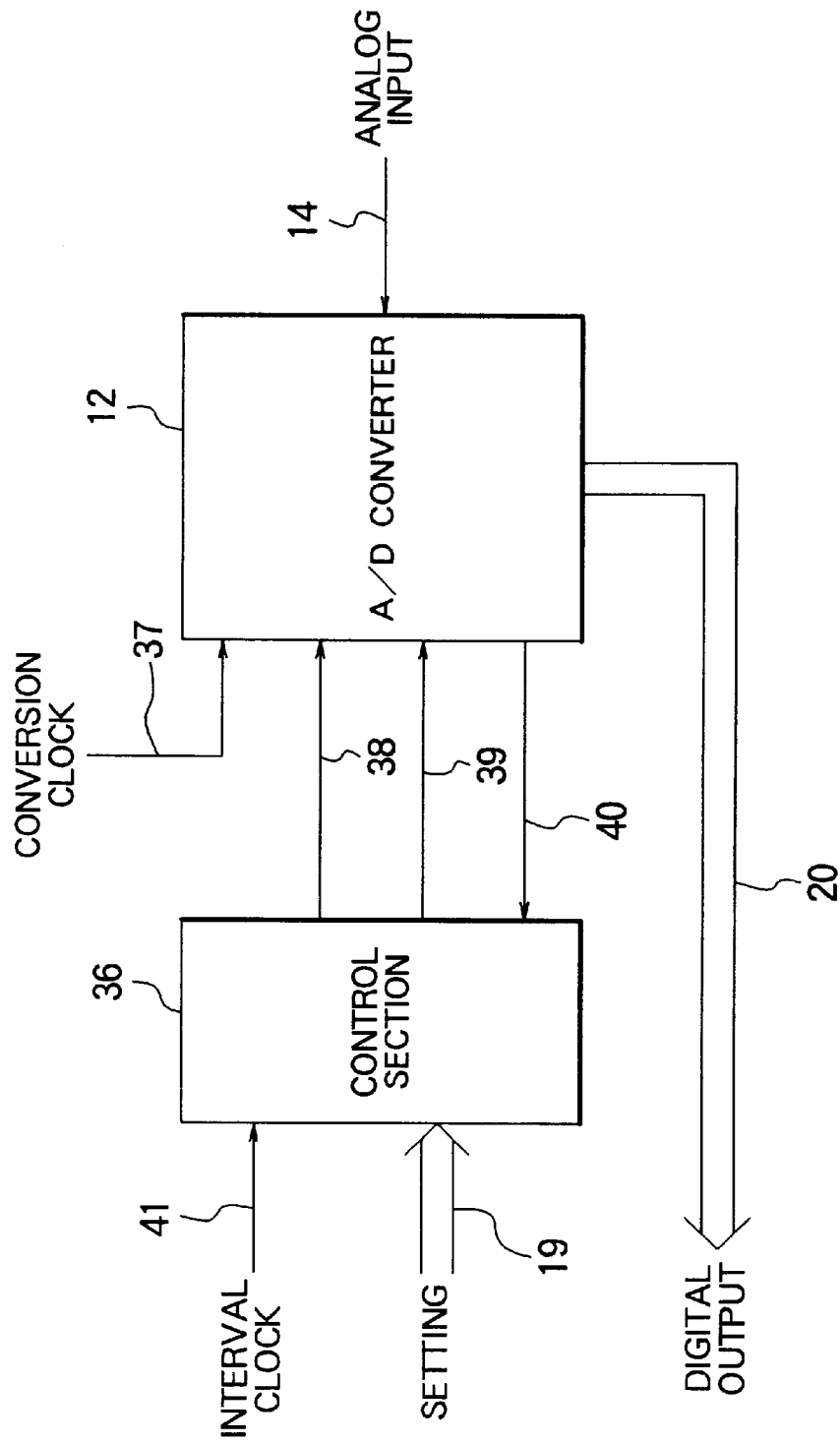
FIG. 1 is a block diagram of a conventional A/D conversion system.
Figure 2:
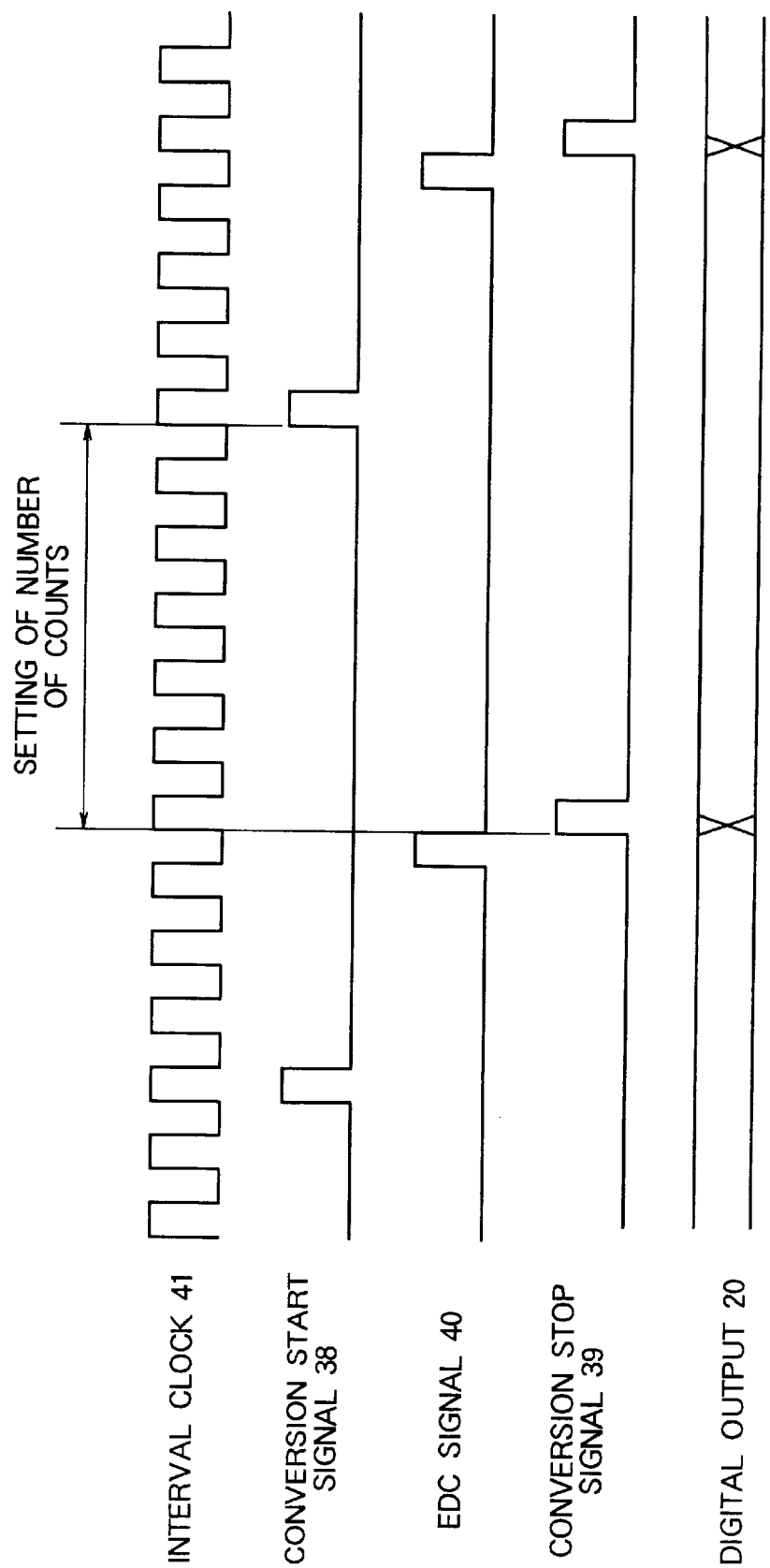
FIG. 2 is a timing chart for the A/D conversion system of FIG. 1.

Now, the present invention is more specifically described with reference to accompanying drawings, wherein similar constituent elements are designated by the same reference numerals throughout the drawings.

Figure 3:
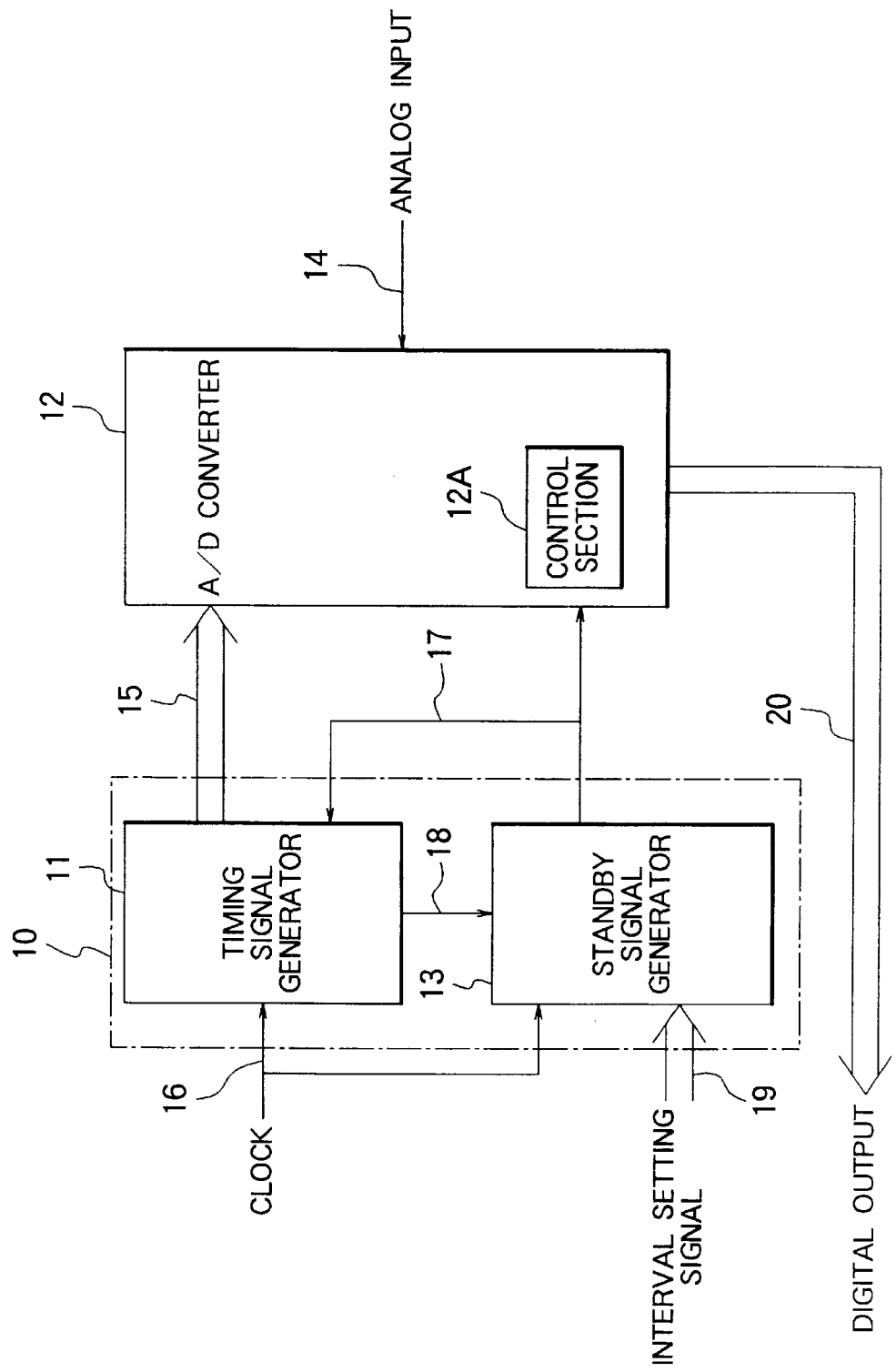
FIG. 3 is a block diagram of an A/D conversion system according to an embodiment of the present invention.

Referring to FIG. 3, an A/D conversion system according to an embodiment of the present invention comprises an A/D converter 12 for effecting an A/D conversion of an input analog signal 14, a mode selection section including a timing signal generator 11 for generating timing signals 15 and 18 and a standby signal generator 13 for generating a standby signal 17, and a control section 12A for breaking a current path for the A/D converter 12 in response to the standby signal. The A/D converter 12 receives analog input signal 14, converts the same to a digital data in response to a clock signal not shown, and supplies the digital output data 20. The timing signal generator 11 receives a clock input 16, and supplies timing signal 15 to the A/D converter 12 for starting and stopping of the A/D conversion and timing signal 18 to the standby signal generator 13 for starting a standby mode.

The standby signal generator 13 receives an interval setting signal 19, clock input 16 and timing signal 18, and generates standby signal 17, which is supplied to both the A/D converter 12 and the timing generator 11, for effecting a standby mode of the A/D conversion for a duration based on the sampling rate of the A/D conversion. In the standby mode wherein standby signal 17 is active, the current path to the main circuit portion of the A/D converter 12 is cut or broken for power saving by the control section 12A, and the timing signal generator stops for counting of the clock pulses.

Figure 4:
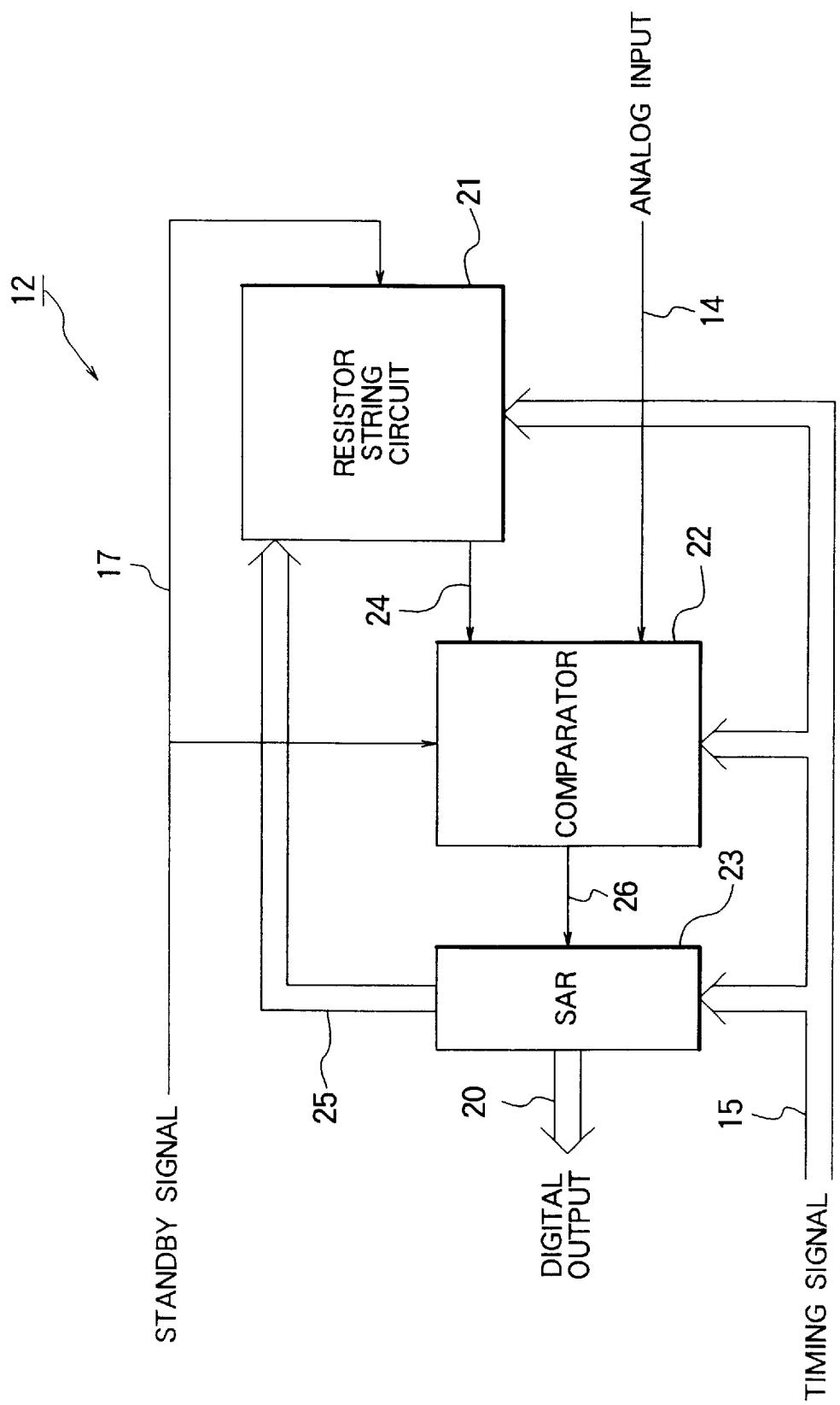
FIG. 4 is a block diagram of an example of the A/D converter shown in FIG. 3.

Referring to FIG. 4, the A/D converter 12 is of a successive approximation type and comprises a resistor string circuit 21 acting as a D/A converter, a comparator 22 for comparison of analog inputs, and a successive approximation register (SAR) 23 for supplying output digital data 20 after completion of the conversion. The resistor string circuit 21 receives a digital feed-back data 25 from the successive approximation register 23 and supplies an internal analog data 24 to the comparator 22 based on digital feed-back data 25. The comparator 22 compares internal analog data 24 from the resistor string circuit 21 against analog input signal 14 input to the A/D conversion system, to thereby output a result signal 26 assuming a high level or low level based on the result of the comparison.

The successive approximation register 23 first stores a provisional data, then increases or decreases the provisional data based on the output of the comparator 22, supplies the increased or decreased data as digital feed-back data 25 to the resistor string Circuit 21, repeats the increase or decrease of the stored provisional data to the least significant bit, and holds and outputs a final data obtained by the successive approximation. Timing signal 15 from the timing signal generator 11 is supplied to the successive approximation register 23, comparator 22 and resistor string circuit 21. Standby signal 17 is supplied to the resistor string circuit 21 and comparator 22.

Figure 5:
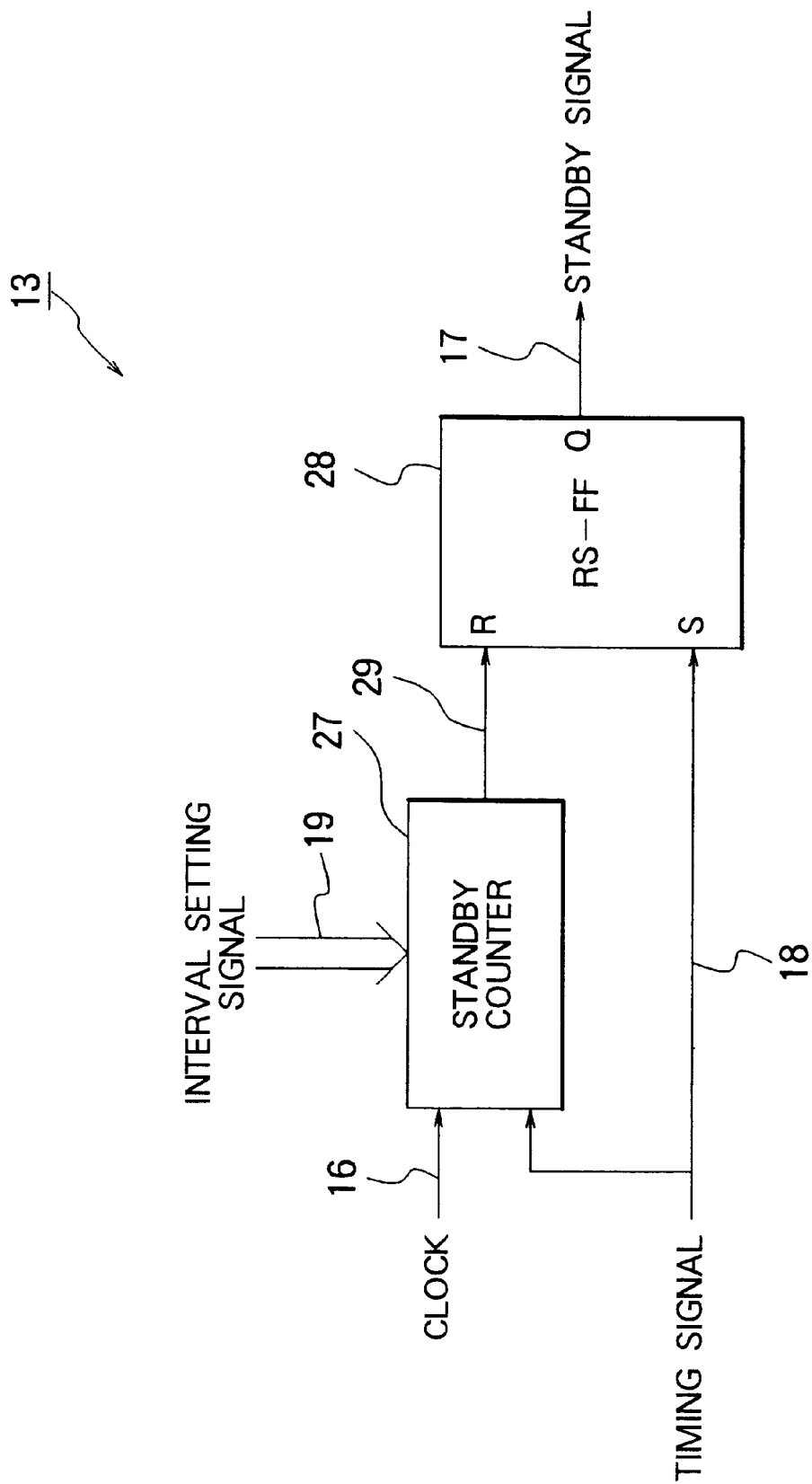
FIG. 5 is a block diagram of an example of the standby signal generator shown in FIG. 3.

Referring to FIG. 5, the standby signal generator 13 comprises a standby counter 27 and a RS-flipflop (RS-FF) 28. The standby counter 27 responds to timing signal 18 to start for counting the clock pulses in the clock signal 16, and counts up to the setting by the interval setting signal 19 to output a reset signal 29 for the RS-FF 28. The RS-FF 28 is set by timing signal 18 and reset by the output 29 of the standby counter 27, and outputs standby signal 17.

Figure 6:
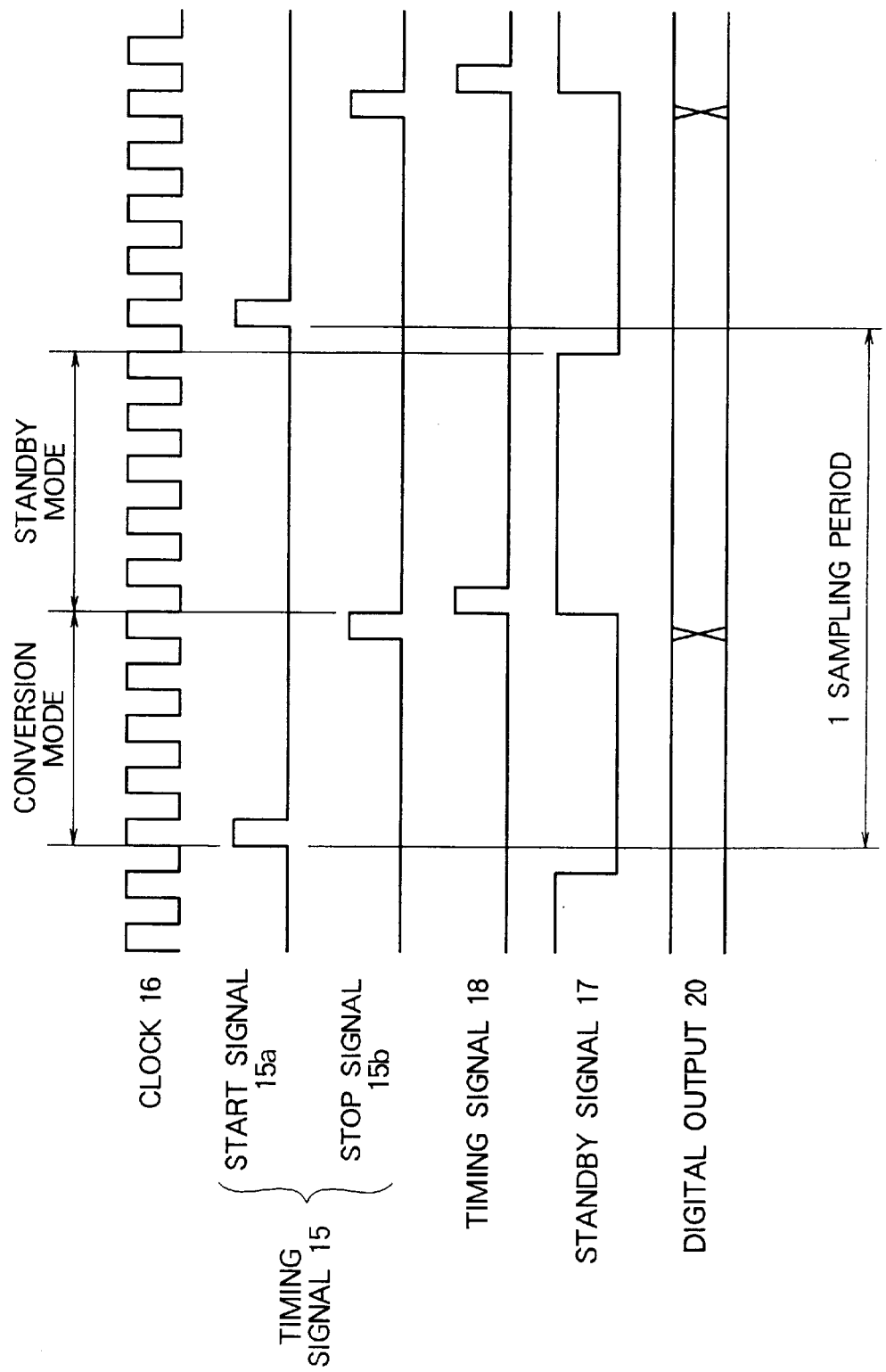
FIG. 6 is a timing chart for the A/D conversion system of FIG. 3.

Referring to FIG. 6, in addition to FIGS. 3, 4 and 5, the timing of the A/D conversion by the A/D conversion system of the present embodiment is controlled mainly by timing signal 15 including a conversion start signal 15a and a conversion stop signal 15b, as follows. When conversion start signal 15a turns to an active level or high level, the comparator 22 shown in FIG. 4 starts for comparing analog input signal 14 against analog internal data 24 decoded by the resistor string circuit 21, to thereby output a high level or low level for allowing the successive approximation register to effect successive approximation. When conversion stop signal 15b turns to an active level or high level, the successive approximation register 20 holds the data stored therein as an output digital data 20 for the duration of the next standby mode. Just after conversion stop signal 15b turns active, timing signal 18 turns active to thereby set the RS-FF 28, which outputs an active level of standby signal 17.

The standby counter 27 starts for counting the clock pulses in clock signal 16 in response to the active level of timing signal 18 and counts up to the setting specified by interval setting signal 19 to thereby output the reset signal for the RS-FF 28, which turns the standby signal 17 to an inactive level. The setting specified by the interval setting signal 19 is determined by the sampling period of the A/D conversion system which is a sum of the time length for the A/D conversion and the time length for the standby mode.

During the time interval when standby signal 17 remains at an active level or high level, the A/D converter 12 stops its operation. After standby signal 17 is reset by the reset signal 29 from the standby counter 27, the timing signal generator 11 starts for operation to turn conversion start signal 15a to an active level or high level, thereby allowing the A/D converter 12 to effect A/D conversion. In this way, the A/D conversion system operates at a specified sampling rate periodically or intermittently.

Figure 7:
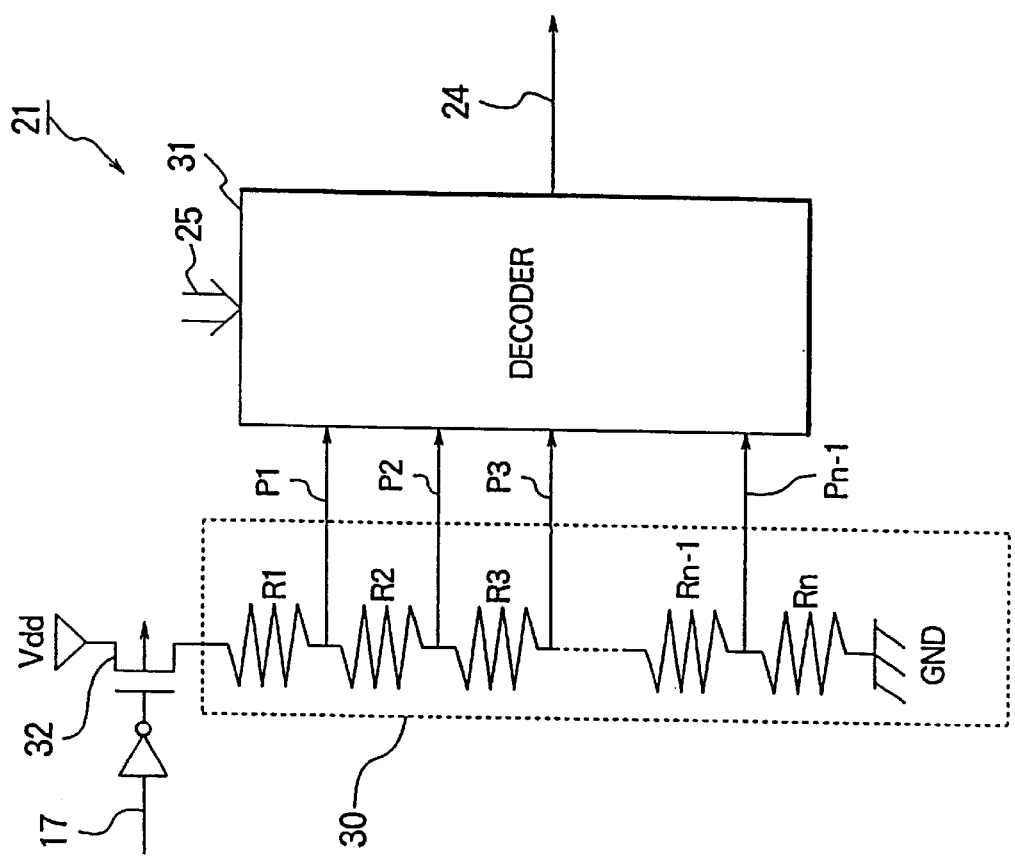
FIG. 7 is a block diagram of an example of the resistor string circuit shown in FIG. 4.

Referring to FIG. 7, an example of the resistor string circuit 21 in the A/D converter 12 comprises a resistor block or resistor string 30 including a plurality of resistors $R_1$ to $R_n$ connected in series between Vdd line and GND, and a decoder 31 for decoding the voltages at the respective taps $p_1$ to $p_{n-1}$ of the resistor string 30. A pMOSFET 32 acting as an element of the control section 12A is connected between Vdd line and the resistor string 30. The pMOSFET 32 receives standby signal 17 and turns off in response to the active level of standby signal 17 to break the current path for the resistor string 30 for power saving during the standby mode. During an A/D conversion mode wherein standby signal 17 is inactive, the decoder 31 receives the feed-back data 25 from the successive approximation register 23, and outputs an analog voltage supplied from one of the taps $p_1$ to $p_{n-1}$ of the resistor string 30 as a decoded feed-back data. In this operation, the resistor string circuit 21 functions as a D/A converter for decoding the feed-back data 25 from the successive approximation register 26.

Figure 8:
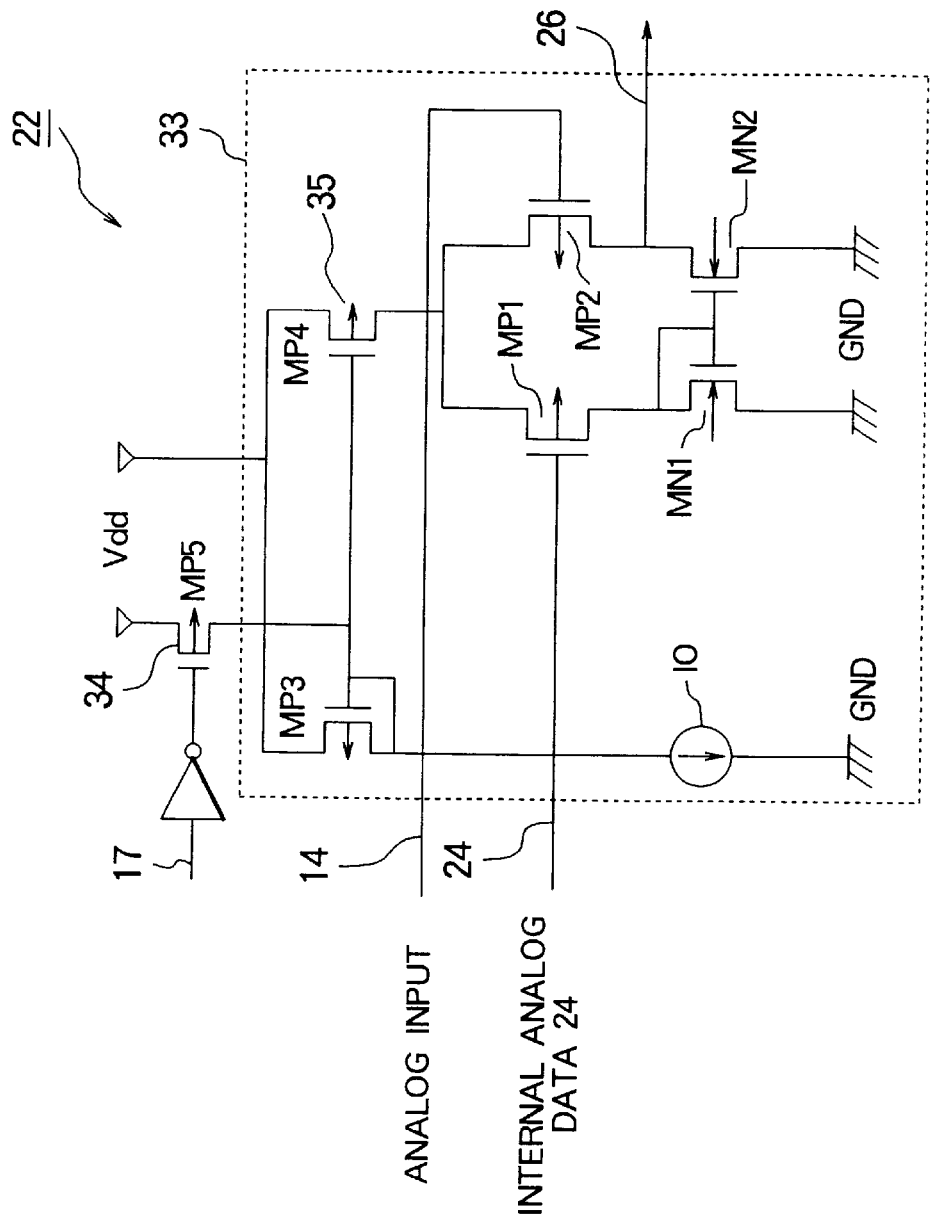
FIG. 8 is a block diagram of an example of the comparator shown in FIG. 4.

Referring to FIG. 8, an example of the comparator 22 in the A/D converter of FIG. 4 comprises a pair of differential transistors formed of pMOSFETs MP1 and MP2, a first current mirror formed of nMOSFETs MN1 and MN2 and connected between the pair of differential transistors MP1 and MP2 and GND for acting as active loads for the pair of differential transistors, a second current mirror formed of pMOSFETs MP3 and MP4 and acting as a constant current source for the pair of differential transistors MP1 and MP2, and a constant current source I0 for providing the constant current for pMOSFET MP3 of the second current mirror. The common gate of the second current mirror MP3 and MP4 is connected to Vdd line through a switching transistor acting as another element of the control section 12A and formed of pMOSFET MP5 having a gate receiving an inverted signal of standby signal 17.

The PMOSFET MP1 receives decoded feed-back data 24 or internal analog data whereas the pMOSFET MP2 receives analog input signal 14. Thus, during an A/D conversion mode, the comparator 22 compares input analog signal 14 against the decoded feed-back data 24 and outputs a high or low level in accordance with the low or high level of the decoded feed-back data 24 with respect to analog input signal 14. On the other hand, during a standby mode, the current path for the comparator 22 is cut by the pMOSFET MP5 for power saving.

In accordance with the A/D conversion system according to the present embodiment, the duration for the standby mode can be specified from outside the system to obtain an optimum periodic or intermittent operation of the system while saving the electric power by cutting the current path for the A/D conversion and by stopping the counting operation of the timing generator.

The variable setting for the standby counter 27 enables a single clock signal to control different timings in the system, thereby avoiding an increase of the size of the system. Further, a single clock signal may be used in common for the A/D converter, timing signal generator and the standby signal generator, if desired.

Since the above embodiments are described only for examples, the present invention is not limited to the above embodiments and various modifications or alterations can be easily made therefrom by those skilled in the art without departing from the scope of the present invention.

What is claimed is:

1. An A/D conversion system comprising a mode selection section for periodically selecting a conversion mode and a standby mode of said A/D conversion system, an A/D converter for converting an analog input signal to a digital output signal during said conversion mode, and a control section for stopping operation of said A/D converter during said standby mode, wherein said mode selection section comprises a timing signal generator for generating a timing signal for ending said conversation mode, and a standby counter for ending said standby mode by counting clock pulses in a clock signal in response to said timing signal up to a set number of counts, wherein said A/D converter is controlled by clock pulses in said clock signal which is also used by said standby counter for A/D conversion.

2. An A/D conversion system comprising:

a timing generator receiving a clock signal and operable to output a timing signal and a conversion status signal;

a standby generator receiving said timing signal from said timing generator, said standby generator further receiving an interval signal and operable to output a standby signal; and an A/D converter receiving said conversion status signal from said timing generator and said standby signal from said standby generator, said A/D converter further receiving an analog input for conversion to a digital signal output, wherein said timing generator outputs said timing signal to activate said standby generator to place said A/D converter and said timing generator in a standby mode when said conversion status signal indicates that no A/D conversion is to take place.

3. The A/D conversion system according to claim 2, wherein said standby generator includes a standby counter which receives said clock signal and wherein said timing generator and said A/D converter are left in said standby mode for an interval corresponding to a time where said standby counter counts pulses in said clock signal up to a value corresponding to said interval signal.

4. The A/D conversion system according to claim 3, wherein said interval signal is set by an operator external to the conversion system to adjust the length of an interval between A/D conversions.

5. The A/D conversion system according to claim 3, wherein said standby generator further includes a flip flop, wherein said timing signal output by said timing generator sets said flip flop to place said A/D converter and said timing generator in said standby mode, and wherein said standby counter resets said flip flop when the value corresponding to said interval signal is reached to deactivate the standby mode of said A/D converter.

6. The A/D converter according to claim 3, wherein said A/D converter includes a comparator and a resistive string circuit which are driven by a power supply voltage, said comparator and said resistive string circuit receiving said standby signal from said standby generator via respective first and second transistors, and wherein when said standby signal is in an active state, said respective first and second transistors switch off said power supply voltage to said comparator and said resistive string circuit.

* * * * *